(12) United States Patent
Hinata

(10) Patent No.: US 10,204,871 B2
(45) Date of Patent: Feb. 12, 2019

(54) SEMICONDUCTOR DEVICE AND SEMICONDUCTOR DEVICE MANUFACTURING METHOD

(71) Applicant: FUJI ELECTRIC CO., LTD., Kanagawa (JP)

(72) Inventor: Yuichiro Hinata, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/445,998

(22) Filed: Mar. 1, 2017

(65) Prior Publication Data

US 2017/0271274 A1 Sep. 21, 2017

(30) Foreign Application Priority Data

Mar. 18, 2016 (JP) .................................. 2016-055628

(51) Int. Cl.
| | |
|---|---|
| *H01L 23/00* | (2006.01) |
| *H01L 21/48* | (2006.01) |
| *H01L 21/56* | (2006.01) |
| *H01L 23/31* | (2006.01) |
| *H01L 23/373* | (2006.01) |

(52) U.S. Cl.
CPC ........ *H01L 23/562* (2013.01); *H01L 21/4882* (2013.01); *H01L 21/565* (2013.01); *H01L 23/3114* (2013.01); *H01L 23/3735* (2013.01)

(58) Field of Classification Search
CPC ... H01L 23/585; H01L 23/562; H01L 23/142; H01L 23/564; H01L 23/18; H01L 23/3178
See application file for complete search history.

(56) References Cited

U.S. PATENT DOCUMENTS

| | | | |
|---|---|---|---|
| 8,472,196 B2* | 6/2013 | Zeng | H01L 23/4952 257/670 |
| 2004/0169271 A1 | 9/2004 | Igarashi et al. | |
| 2014/0048918 A1* | 2/2014 | Nagaune | H01L 23/4334 257/675 |
| 2014/0332951 A1* | 11/2014 | Nakamura | H01L 23/3142 257/712 |

FOREIGN PATENT DOCUMENTS

| | | |
|---|---|---|
| JP | H06-13501 A | 1/1994 |
| JP | 2009-64852 A | 3/2009 |

* cited by examiner

*Primary Examiner* — Marc Armand
*Assistant Examiner* — Sarah Salerno

(57) ABSTRACT

Provided is a semiconductor device including an insulating plate; a first conducting portion formed on a first surface of the insulating plate; a semiconductor element mounted on the first conducting portion; and a mold material that seals the first conducting portion and the semiconductor element on the first surface side of the insulating plate. A material of the insulating plate has higher adhesion with respect to the mold material than a material of the first conducting portion, and the first conducting portion includes a gap that is filled with the mold material between the first conducting portion and the insulating plate in a portion thereof.

18 Claims, 11 Drawing Sheets

(a)

SEMICONDUCTOR DEVICE AND SEMICONDUCTOR DEVICE MANUFACTURING METHOD

The contents of the following Japanese patent applications are incorporated herein by reference:
NO. 2016-055628 filed on Mar. 18, 2016.

BACKGROUND

1. Technical Field

The present invention relates to a semiconductor device and a semiconductor device manufacturing method.

2. Related Art

A semiconductor device is known in which a semiconductor element is mounted on a conductive pattern and sealed with resin, as shown in Patent Documents 1 to 4, for example.

Patent Document 1: Japanese Patent Application Publication No. H6-13501
Patent Document 2: Japanese Patent Application Publication No. 2004-207277
Patent Document 3: Japanese Patent Application Publication No. 2009-64852
Patent Document 4: International Publication WO 2013/118478

However, when the resin is not sufficiently secured to the conductive pattern, there is a concern that peeling occurs at the interface between the conductive pattern and the resin, thereby reducing the reliability of the semiconductor device.

SUMMARY

According to a first aspect of the present invention, provided is a semiconductor device comprising an insulating plate; a first conducting portion provided on a first surface of the insulating plate; a semiconductor element mounted on the first conducting portion; and a mold material that seals the first conducting portion and the semiconductor element on the first surface side of the insulating plate, wherein a material of the insulating plate has higher adhesion with respect to the mold material than a material of the first conducting portion, and the first conducting portion includes a gap that is filled with the mold material between the first conducting portion and the insulating plate in a portion thereof. In relation to the first aspect, provided is a manufacturing method of the semiconductor device comprising preparing the insulating plate having the first conducting portion provided on the first surface thereof; mounting the semiconductor element on the first conducting portion; and sealing the first conducting portion and the semiconductor element on the first surface side of the insulating plate with the mold material, wherein the material of the insulating plate has higher adhesion with respect to the mold material than the material of the first conducting portion, and the sealing includes filling, with the mold material, the gap between the first conducting portion and the insulating plate in a portion thereof.

According to a second aspect of the present invention, provided is a semiconductor device comprising an insulating plate; a first conducting portion provided on a first surface of the insulating plate; a semiconductor element mounted on the first conducting portion; and a mold material that seals the first conducting portion and the semiconductor element on the first surface side of the insulating plate, wherein the first conducting portion includes a plurality of convex portions provided on the insulating plate side and bonded to the first surface of the insulating plate at different positions distanced from each other; and a gap that is filled with the mold material between the first conducting portion and the insulating plate, in at least a portion of a region between adjacent convex portions. In relation to the second aspect, provided is a manufacturing method of the semiconductor device comprising preparing the insulating plate having the first conducting portion provided on the first surface thereof; mounting the semiconductor element on the first conducting portion; and sealing the first conducting portion and the semiconductor element on the first surface side of the insulating plate with the mold material, wherein the first conducting portion includes the plurality of convex portions provided on the insulating plate side and bonded to the first surface of the insulating plate at different positions distanced from each other, and the sealing includes filling, with the mold material, the gap between the first conducting portion and the insulating plate, in at least a portion of a region between adjacent convex portions.

According to a third aspect of the present invention, provided is a semiconductor device comprising an insulating plate; a first conducting portion that includes a metal film formed on a first surface of the insulating plate and a metal plate bonded to the metal film; a semiconductor element mounted on the metal plate; and a mold material that seals the first conducting portion and the semiconductor element on the first surface side of the insulating plate, wherein at least a portion of a region between the metal plate and the insulating plate is not provided with the metal film and includes a gap that is filled with mold material. In relation to the third aspect, provided is a manufacturing method of the semiconductor device comprising preparing the insulating plate on which is provided the first conducting portion that includes the metal film formed on a first surface of the insulating plate and the metal plate bonded to the metal film; mounting the semiconductor element on the metal plate; and sealing the first conducting portion and the semiconductor element on the first surface side of the insulating plate with the mold material, wherein the sealing includes, in at least a portion of a region between the metal plate and the insulating plate, not providing the metal film and filling the gap with the mold material.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

(1: The Semiconductor Device 10 According to the Present Embodiment)

(1.1: Configuration of the Semiconductor Device 10)

Figure 1:
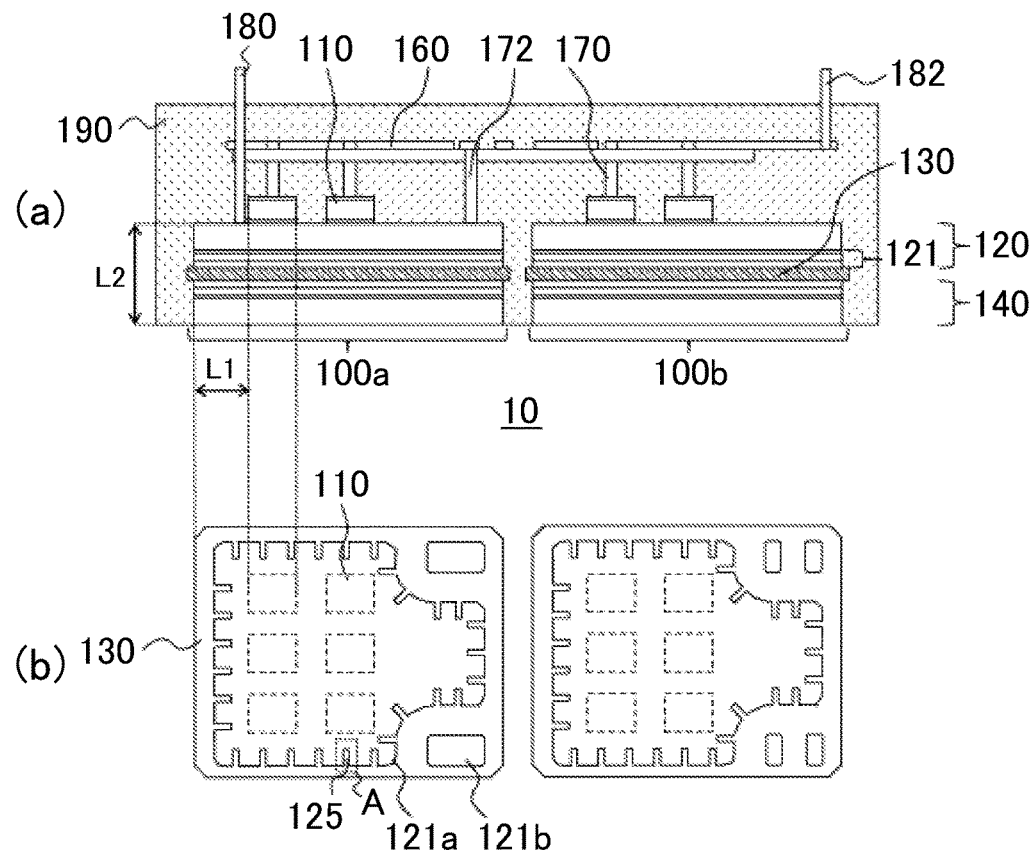
FIG. 1 shows an example of the semiconductor device 10 according to the present embodiment.

FIG. 1 shows an example of the semiconductor device 10 according to the present embodiment. For example, the semiconductor device 10 may be an electronic component with a power semiconductor element mounted thereon for power control used for power control or the like in manufacturing equipment or robots. In FIG. 1, (a) is a cross-sectional view of the semiconductor device 10 in the longitudinal direction. First, (a) of FIG. 1 is used to describe the layer configuration of the semiconductor device 10. The semiconductor device 10 includes a semiconductor element 110, a first conducting portion 120, an insulating plate 130, a second conducting portion 140, a printed circuit board 160, a conducting post 170, an external terminal 180, an external terminal 182, and a mold material 190.

The semiconductor element 110 may be a power semiconductor element mounted on the first conducting portion 120. For example, the semiconductor element 110 is a switching element formed from a compound semiconductor such as SiC, and a vertical metal oxide semiconductor field effect transistor (MOSFET), insulated gate bipolar transistor (IGBT), or the like having electrodes respectively on a first surface (top surface) and a second surface (bottom surface) thereof can be adopted as the semiconductor element 110. The semiconductor element 110 is not limited to being a vertical element, and may be a horizontal element with electrodes only on a front surface.

For example, in a case where the semiconductor element 110 is a MOSFET (or IGBT), the semiconductor element 110 may include a source electrode (or emitter electrode) and a gate electrode bonded to a conducting post 170 on the first surface (top surface) side, and a drain electrode (collector electrode) on the back surface side. Furthermore, the semiconductor element 110 may have the drain electrode (or collector electrode) connected to the first conducting portion 120 on the second surface (bottom surface) side, and may be secured on the insulating plate 130 via the first conducting portion 120. A conductive bonding agent for bonding the first conducting portion 120 and the conducting post 170 may be provided on both surfaces of the semiconductor element 110.

The first conducting portion 120 secures the semiconductor element 110 to the insulating plate 130. The first conducting portion 120 may have a multilayer configuration, and may include a gap formation layer 121 that has a gap filled with a mold material between itself and the insulating plate 130 in at least a portion thereof. The first conducting portion 120 may include copper in at least a portion thereof. The details of the first conducting portion 120 are described further below.

The insulating plate 130 includes a first surface on which the first conducting portion 120 is provided and a second surface on which the second conducting portion 140 is provided, and electrically insulates the first conducting portion 120 and the second conducting portion 140. The insulating plate 130 may be an insulating substrate with at least a certain strength, and may be a ceramic plate formed from an insulating ceramic such as aluminum nitride, silicon nitride, aluminum oxide, or the like, for example. Instead, the insulating plate 130 may be a resin substrate or the like.

The second conducting portion 140 releases the heat generated from the semiconductor element 110 from a bottom portion of the semiconductor device 110, via the first conducting portion 120 and the insulating plate 130. The second conducting portion 140 may have a multilayer configuration. The details of the second conducting portion 140 are described further below.

The printed circuit board 160 is a substrate connecting the electrodes of the semiconductor element 110 to an external terminal 182, and includes an insulating base material and a wiring pattern formed on the surface thereof A rigid substrate formed from a glass epoxy material or the like or a flexible substrate formed from polyimide or the like, for example, can be adopted as the insulating base material. In the insulating base material, a plurality of through-holes are provided through which the conducting post 170, the external terminal 180, and the external terminal 182 pass. The wiring pattern is provided on the front surface of the insulating base material, using a conductive metal such as copper, aluminum, or the like. For example, the wiring pattern of the printed circuit board 160 connects the conducting post 170 to the external terminal 180 and the external terminal 182.

The conducting post 170 is provided between the semiconductor element 110 and the printed circuit board 160, is a conducting member for providing conduction between the semiconductor element 110 and the printed circuit board 160, and is formed as a cylindrical pillar using a conductive metal such as copper, aluminum, or the like, for example. Each conducting post 170 is established on top of the semiconductor element 110 by having the bottom end thereof connected to the semiconductor element 110 using a conductive bonding agent such as solder, and the top end thereof may be connected to the wiring pattern of the printed circuit board 160 by solder, brazing, or caulking.

As an example, the conducting post 170 may include three posts for one semiconductor element 110. In this case, two of the three posts may be established on the source electrode or on terminals connected to the source electrode of the semiconductor element 110 and may be connected to the wiring pattern on the printed circuit board 160, and the remaining one post may be established on the gate electrode of the semiconductor element 110 or a terminal connected to the gate electrode and may be connected to the wiring pattern on the printed circuit board 160.

The external terminal 180 and the external terminal 182 are terminals for conducting current output from the semiconductor element 110 and outputting this current to the outside of the semiconductor device 10. The external terminal 180 and the external terminal 182 may each include a plurality of terminals, and each terminal may be formed into a cylindrical pillar or square pillar using a conductive metal such as copper, aluminum, or the like, for example.

As an example, the external terminal 180 is established on the first conducting portion 120 and extends upward through a hole of the printed circuit board 160 to protrude from the mold material 190. The external terminal 180 is connected to the drain terminal and the source terminal of the semiconductor element 110 via the wiring pattern of the printed circuit board 160, and may function as an output terminal.

Furthermore, as an example, the external terminal 182 is established on the wiring pattern of the printed circuit board 160 and extends upward to protrude from the mold material 190. The external terminal 182 is connected to the gate electrode of the semiconductor element 110 via the conducting post 170 and the wiring pattern of the printed circuit board 160, and may function as a gate terminal. In this way, the external terminal 182 inputs a control signal to the semiconductor element 110 from outside the semiconductor device 10.

The mold material 190 seals a portion of the semiconductor element 110, the first conducting portion 120, the insulating plate 130, the second conducting portion 140, the printed circuit board 160, the conducting posts 170, the external terminal 180, and the external terminal 182, in a state such that a portion of the external terminal 180 and the external terminal 182 are exposed. The mold material 190 may be a heat curable resin having higher adhesion with the material of the insulating plate 130 than with the material of the first conducting portion 120.

Here, a case where a force of the peeling of the mold material 190 when the mold material 190 is secured on the material of the insulating plate 130 and a force is applied in a planar direction of the material of the insulating plate 130 is greater than a force of the peeling of the mold material 190 when the mold material 190 is secured on the material of the first conducting portion 120 and a force is applied in a planar direction of the material of the first conducting portion 120 may be referred to as a case where "the adhesion with the material of the insulating plate 130 is higher than the adhesion with the material of the first conducting portion 120."

As an example, epoxy resin can be favorably used for the mold material 190. Instead, the mold material 190 may be polyimide resin, isocyanate resin, amino resin, phenol resin, silicon-type resin, or another heat curable resin. The mold material 190 may further contain an additive such as an inorganic filler.

Here, the semiconductor device 10 may be formed by a plurality of units that each have one or more semiconductor elements 110 mounted thereon. For example, as shown in (a) of FIG. 1, the semiconductor device 10 may be formed by a plurality of units (unit 100a and unit 100b) that each include the semiconductor element 110, the first conducting portion 120, the insulating plate 130, and the second conducting portion 140. In a case where no distinction is made between the unit 100a and the unit 100b, this component is simply referred to as the unit 100.

In FIG. 1, (b) is a planar view of the unit 100a and the unit 100b shown in (a) of FIG. 1 as seen from the top surface side of the gap formation layer 121. The dotted lines indicate the regions on the gap formation layer 121 corresponding to the regions where a semiconductor element 110 is mounted on the top surface of the first conducting portion 120.

Here, the first conducting portion 120 may include a plurality of conducting members that are distanced from each other and include a main conducting member having the largest area and at least one sub conducting member. The gap formation layer 121a in (b) of FIG. 1 indicates a portion corresponding to the main conducting member within the gap formation layer 121, and the gap formation layer 121b indicates the portion corresponding to the sub conducting member within the gap formation layer 121.

One or more concave portions 125 are provided in the outer edge portion of the gap formation layer 121a, extending in an inward direction of the gap formation layer. For example, a plurality of concave portions 125 may be provided at uniform intervals or at different intervals in the outer edge of the gap formation layer 121a. When resin-sealing the semiconductor device 10 with the mold material 190, the concave portions 125 are also filled with the mold material 190. As described further below, the first conducting portion 120 has a portion (e.g. the portion corresponding to the concave portion 125) with a gap between itself and the insulating plate 130 that is filled with the mold material.

Figure 2:
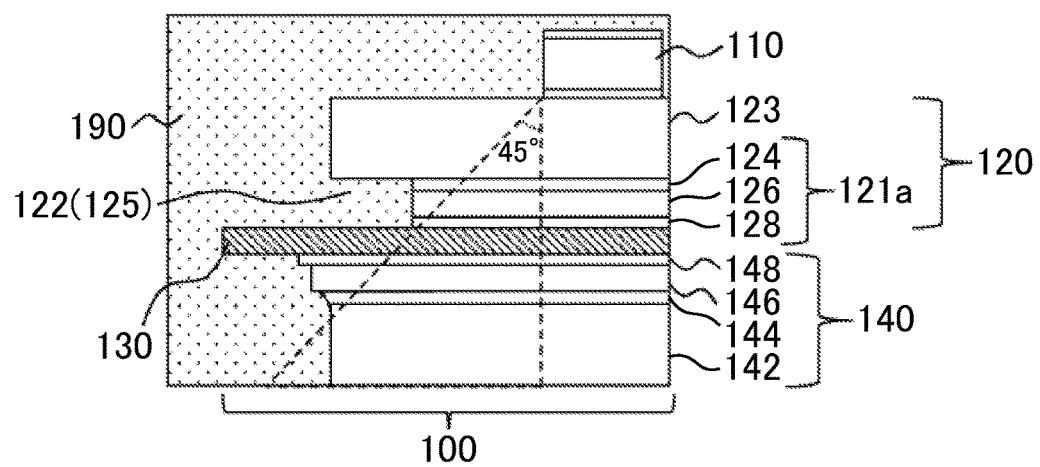
FIG. 2 shows a partial cross section of a unit 100 of the semiconductor device 10 shown in FIG. 1.

FIG. 2 shows a partial cross section of a unit 100 of the semiconductor device 10 shown in FIG. 1.

(1.2: Configuration of the First Conducting Portion 120)

First, the configuration of the first conducting portion 120 is described. As shown in the drawings, the first conducting portion 120 includes a metal plate 123, a bonding layer 124, a metal film 126, and a bonding layer 128.

The metal plate 123 has the semiconductor element 110 mounted on a first surface (top surface) and the metal film 126 mounted on a second surface (bottom surface) via the bonding layer 124. As an example, the metal plate 123 may be a copper board with a thickness from 0.1 mm to 3 mm, e.g. 1 mm. The metal plate 123 may have a circuit pattern for connecting the semiconductor element 110 and the external terminal 180 formed thereon.

The bonding layer 124 is a layer that bonds the metal plate 123 and the metal film 126, and may be formed by a conductive bonding agent. For example, the bonding layer 124 may be formed by a solder material and, as an example, may be formed by a tin-silver type of solder board with a thickness of 0.1 mm.

The metal film 126 is formed on the first surface of the insulating plate 130 via the bonding layer 128. As an example, the metal film 126 may be copper foil with a thickness from 0.1 mm to 1 mm, e.g. a thickness of 0.3 mm. The metal film 126 may have a circuit pattern corresponding to the metal plate 123 formed thereon.

The bonding layer 128 is a layer bonding the metal film 126 and the insulating plate 130, and may be formed by a conductive bonding agent such as a brazing material. As an example, the bonding layer 128 may be formed by silver brazing with a thickness of 0.02 mm.

Here, in at least a portion of the region between the metal plate 123 and the insulating plate 130, the first conducting portion 120 includes a gap 122 (corresponding to a concave portion 125) where the metal film 126 is not provided and that is filled with the mold material 190. For example, as shown in FIG. 2, between the metal plate 123 and the insulating plate 130, the bonding layer 124, the metal film 126, and the bonding layer 128 form the gap formation layer 121a, and a concave portion 125 in which the bonding layer 124, the metal film 126, and the bonding layer 128 are not present is provided in this gap formation layer 121a.

If the concave portions 125 are not provided, the unit 100 is secured to the mold material 190 mostly by the adhesion between the metal plate 123 and the mold material 190, but with the semiconductor device 10 according to the present embodiment that includes the concave portions 125, an anchoring effect achieved by filling the concave portions 125 with the mold material 190 makes it more difficult for the mold material 190 to peel away from the unit 100. Furthermore, if the mold material 190 used has higher adhesion with the material of the insulating plate 130 than with the material of the first conducting portion 120, by improving the adhesion between the unit 100 and the mold material 190, it becomes more difficult for the mold material 190 to peel away from the unit 100. In this way, with the semiconductor device 10, it is possible to prevent the unit 100 from peeling away from the mold material 190 and improve the reliability.

The concave portions 125 may be provided in a manner such that at least some of the concave portions 125 are positioned outside a spatial region widening with an angle of 45 degrees from the contact surface with the semiconductor element 110 and the first conducting portion 120 toward the insulating plate 130. As an example, the concave portions 125 may be formed on the outer side (left side) of the region indicated by the right-angle triangle formed by dashed lines in FIG. 2.

The release of heat from the semiconductor element 110 significantly expands in a range with an angle of 45 degrees downward. Here, by adopting this configuration, the release of heat from the semiconductor element 110 is not impeded in the range of 45 degrees in the bottom portion of the semiconductor element 110, and therefore the semiconductor element 110 can effectively release heat.

As shown in (b) of FIG. 1, the concave portions 125 do not need to be provided in a portion of the gap formation layer 121b. As a result, the concave portions 125 may be provided for only a portion of the conducting members that includes the main conducting member among the plurality of conducting members of the first conducting portion 120. In this case the concave portions 125 are provided in the main conducting member that has a larger area, and therefore it is possible to make the effect of forming the concave portions 125 on the shape of the main conducting member relatively small. Furthermore, instead of or in addition to being provided in the gap formation layer 121a, one or more concave portions 125 may also be provided in the outer edge portion of the gap formation layer 121b.

(1.3: Configuration of the Second Conducting Portion 140)

Next, the configuration of the second conducting portion 140 is described. The second conducting portion 140 includes a metal plate 142, a bonding layer 144, a metal film 146, and a bonding layer 148.

The metal plate 142 functions as a heat releasing plate, and is bonded to the metal film 146 via the bonding layer 144. For example, the metal plate 142 may be a copper board with a thickness from 0.1 mm to 3 mm, e.g. 1 mm. The metal plate 142 may have a substantially rectangular solid pattern. Here, the term "substantially rectangular" may include a shape obtained by chamfering the corner portions from a rectangular shape, a shape similar to a rectangle, and a rectangular shape.

The bonding layer 144 is a layer bonding the metal plate 142 and the metal film 146 to each other, and may be formed by a conductive bonding agent. For example, the bonding layer 144 may be formed by a solder material and, as an example, may be formed by a tin-silver type of solder board with a thickness of 0.05 mm to 0.5 mm, e.g. a thickness of 0.1 mm. Here, the bonding layer 144 may have a portion that protrudes beyond the metal plate 142 toward an outer side and a second surface side (bottom side) of the main surface, and may protrude by approximately 0.1 mm toward the outer side of the main surface of the metal plate 142, for example. In this way, the bonding layer 144 can more firmly bond the metal plate 142 and the metal film 146.

The metal film 146 is formed on the second surface of the insulating plate 130 via the bonding layer 148. For example, the metal film 146 may be copper foil with a thickness of 0.1 mm to 1 mm, e.g. a thickness of 0.3 mm. The metal film 146 may have a substantially rectangular solid pattern corresponding to the metal plate 142. The metal film 146 may have a larger surface than the metal plate 142.

The bonding layer 148 is a layer for bonding the metal film 146 and the insulating plate 130 to each other and may be formed by a conductive bonding agent such as a brazing material. For example, the bonding layer 148 may be formed by silver brazing with a thickness of 0.01 mm to 0.1 mm, e.g. a thickness of 0.02 mm. The bonding layer 148 may have a larger surface than the metal film 146 and a smaller surface than the insulating plate 130.

The metal film 126, the bonding layer 128, the insulating plate 130, the metal film 146, and the bonding layer 148 may each be an AMB (Active Metal Brazing) substrate formed using an AMB technique. Instead, the metal film 126 and the metal film 146 may be bonded to the insulating plate 130 without the bonding layer 128 and the bonding layer 148 being interposed. In this case, the metal film 126, the insulating plate 130, and the metal film 146 may each be a DCB (Direct Copper Bond) substrate formed using a DCB technique.

FIG. 2 is used to describe an embodiment in which a gap is not provided in the second conducting portion 140. Instead, the second conducting portion 140 may have a gap that is filled with the mold material 190 between a portion of the second conducting portion 140 and the insulating plate 130. In this case, in the same manner as the gap formation layer 121a of the first conducting portion 120, the second conducting portion 140 may have a gap (concave portion) formed by not providing the bonding layer 144, the metal film 146, and the bonding layer 148 between the insulating plate 130 and the metal plate 142.

Figure 3:
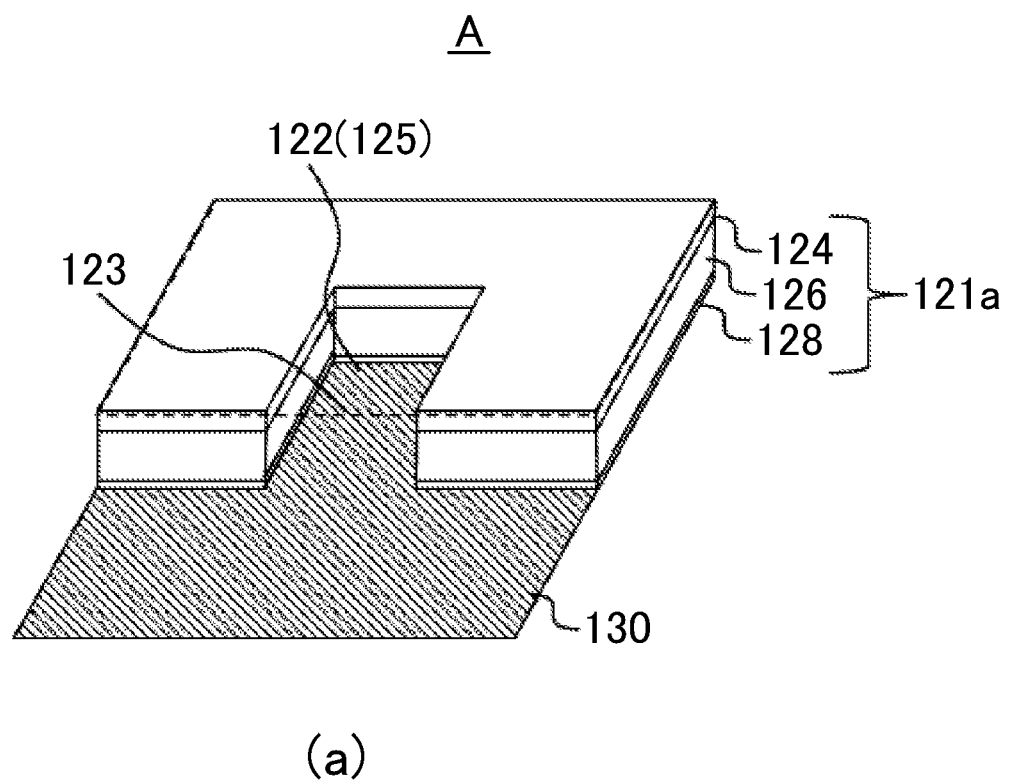
FIG. 3 is a perspective view relating to section A in FIG. 1.

FIG. 3 is a perspective view relating to section A in FIG. 1. The dotted line in the drawing represents the bottom surface of the metal plate 123. As shown in the drawing, the concave portion 125 is formed as a non-penetrating hole surrounded by the concave portion of the metal film 126, the second surface (bottom surface) of the metal plate 123, and the first surface (top surface) of the insulating plate 130. The semiconductor device 10 generates an anchor effect by having this non-penetrating hole filled with the mold material 190, and can more securely fasten the mold material 190 and the unit 100.

In the embodiment shown in FIG. 3, the concave portion is provided in the metal film 126, and can be created by etching or the like when creating the pattern of the substrate. In this way, since a concave portion is not provided in the metal plate 123 as in the gap formation layer 121a, there is no need for additional processing to provide the concave portion in the metal plate 123. Instead of or in addition to this, the metal plate 123 may undergo groove machining or the like to be provided with a concave portion having a shape corresponding to the concave portion of the gap formation layer 121a.

(1.3: Shape of the Concave Portion 125)

Figure 4:
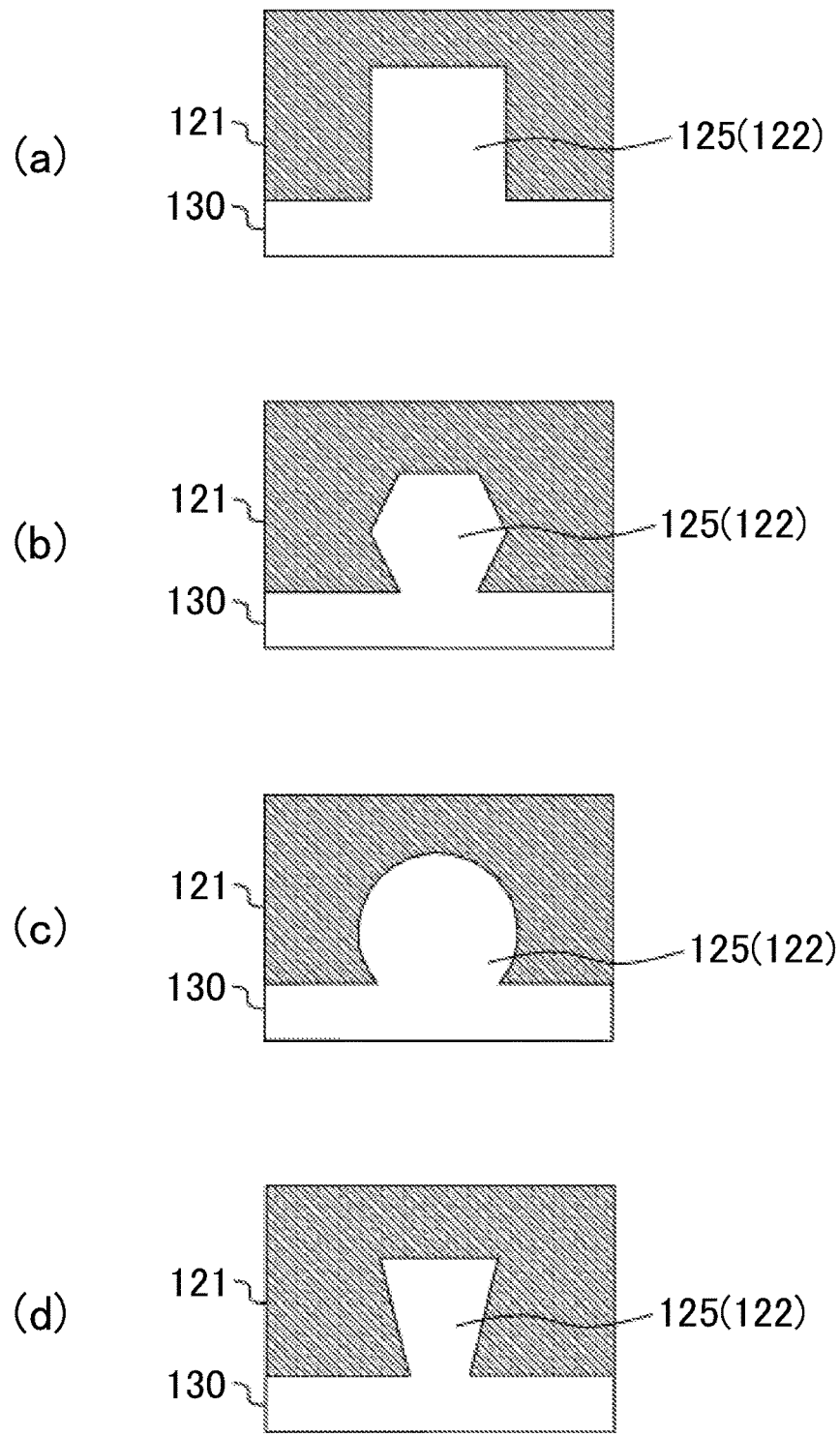
FIG. 4 shows variations in the shape of the concave portion 125 on the insulating plate 130.
Figure 5:
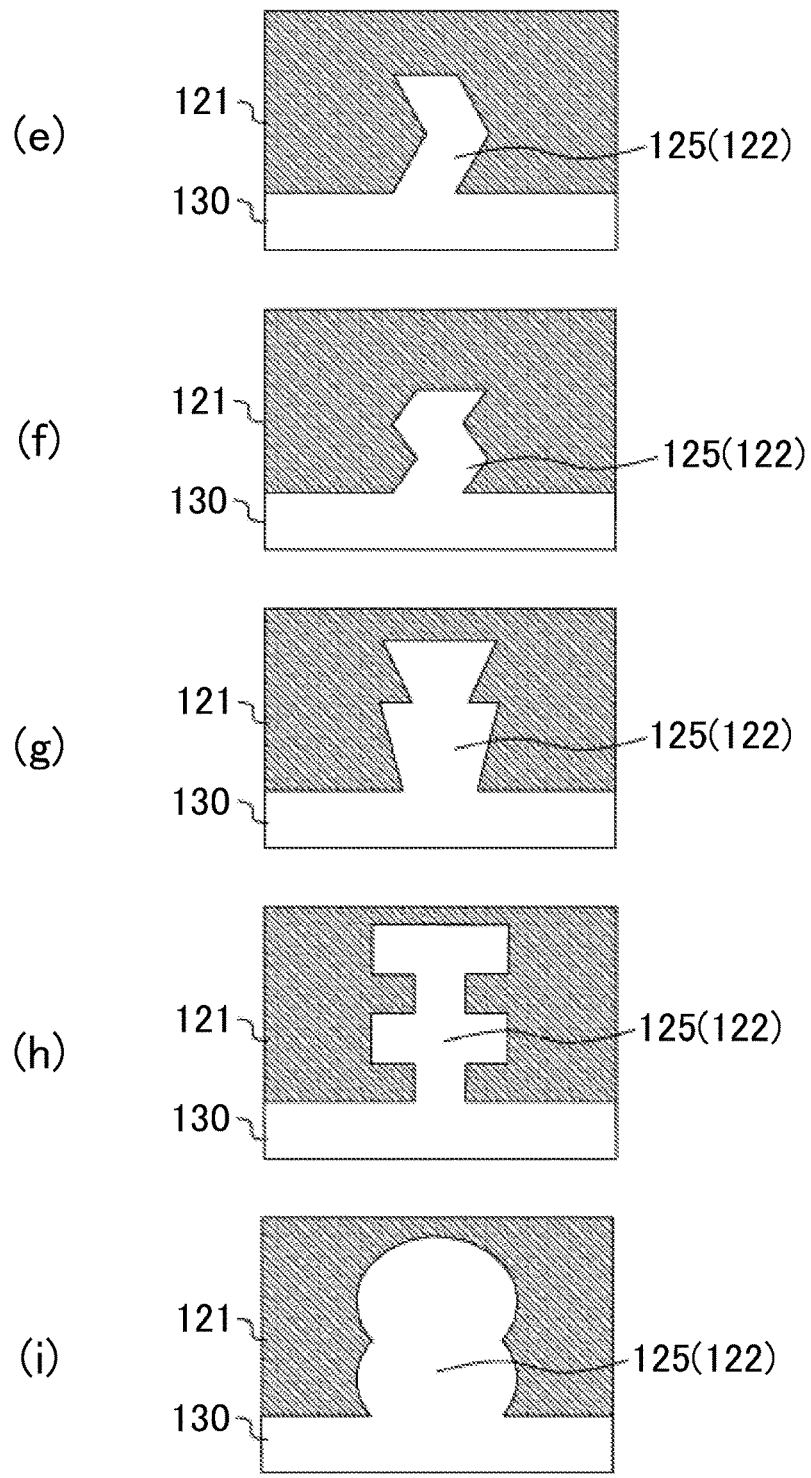
FIG. 5 shows variations in the shape of the concave portion 125 on the insulating plate 130.

FIGS. 4 and 5 show variations in the shape of the concave portion 125 on the first surface (and/or second surface) of the insulating plate 130.

The concave portion 125 may have a polygonal shape. For example, the concave portion 125 may have a regular polygon shape or a non-regular polygon shape, and may have a rectangular shape as shown in (a) of FIG. 4 or a hexagonal shape as shown in (b) of FIG. 4, for example. The concave portion 125 may have a shape including at least a portion of a circular or an elliptical shape, and may have a circular shape except for a bow-shaped region in a bottom portion as shown in (c) of FIG. 4, for example. The concave portion 125 may have a shape whereby the opening width increases or decreases in a direction from the edge portion of the first conducting portion 120 (or the second conducting portion 140) toward the inside of the concave portion 125, and may be shaped as a stage in which the edge portion side is shorter, as shown in (d) of FIG. 4, for example.

The concave portion 125 may have a shape with at least one bend or curve from the edge portion of the first conducting portion 120 (or the second conducting portion 140) toward the inside of the concave portion 125, and may have a shape with one bend as shown in (e) of FIG. 5 or with two bends as shown in (f) of FIG. 5, for example. The concave portion 125 may have a shape whereby the opening width increases, then decreases, and then increases again in a direction from the edge portion of the first conducting portion 120 (or the second conducting portion 140) toward the inside of the concave portion 125, and may be shaped as two stages linked in parallel and being short on the edge portion side as shown in (g) of FIG. 5, two convex shapes linked in series and protruding toward the edge portion side as shown in (h) of FIG. 5, or two linked circular (or elliptical) shapes as shown in (i) of FIG. 5, for example. The concave portion 125 may have a shape whereby the opening width decreases, increases, and then decreases again in a direction from the edge portion of the first conducting portion 120 (or the second conducting portion 140) toward the inside of the concave portion 125, e.g. a shape obtained as an up-down inversion of the concave portion 125 shown in (g) of FIG. 5.

By adopting any one of the shapes described above, for example, the concave portion 125 more firmly secures the mold material 190 due to the anchor effect, and can prevent the mold material 190 from peeling away from the unit 100. Furthermore, the concave portion 125 preferably has a shape with chamfered corners, in consideration of the dispersion of stress. For example, the concave portion 125 may have a shape obtained by chamfering the corners of the shapes shown in (a), (b), and (d) of FIG. 4 and (e) to (h) of FIG. 5.

(2: The Semiconductor Device 10 According to a Modification)

Figure 6:
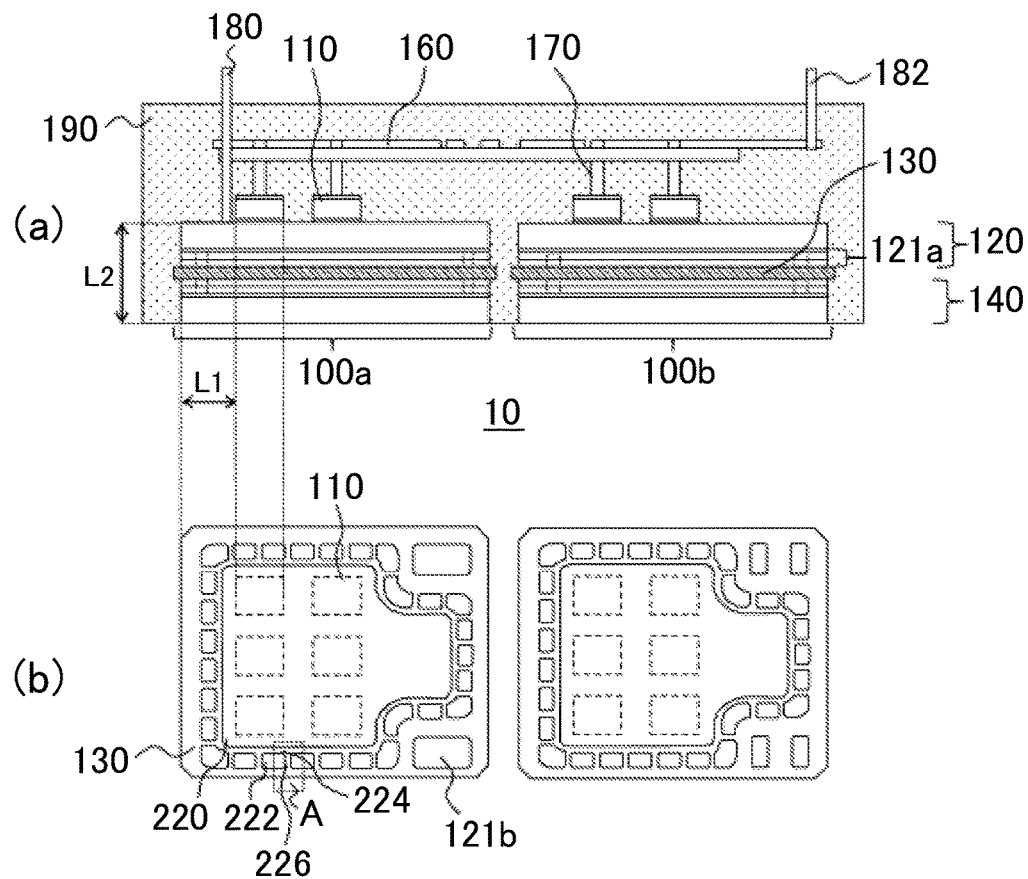
FIG. 6 shows an exemplary semiconductor device 10 according to a modification of the present embodiment.

FIG. 6 shows an exemplary semiconductor device 10 according to a modification of the present embodiment. In the present modification, descriptions of points that are the same as in the semiconductor device 10 of the embodiment described in FIGS. 1 to 3 are omitted. In the present modification, the first conducting portion 120 includes a body portion 220 and a plurality of convex portions 222 in the gap formation layer 121*a*.

The body portion 220 is provided on the first surface side of the insulating plate 130, and has the semiconductor element 110 mounted thereon. The convex portions 222 are island-shaped portions protruding downward from the metal plate 123 in the first conducting portion 120, and a plurality of the convex portions 222 are provided on the first surface side of the insulating plate 130 at different positions distanced from each other. Gaps 224 are formed between the body portion 220 and the convex portions 222, and gaps 226 are formed between at least some of the adjacent convex portions 222.

Figure 7:
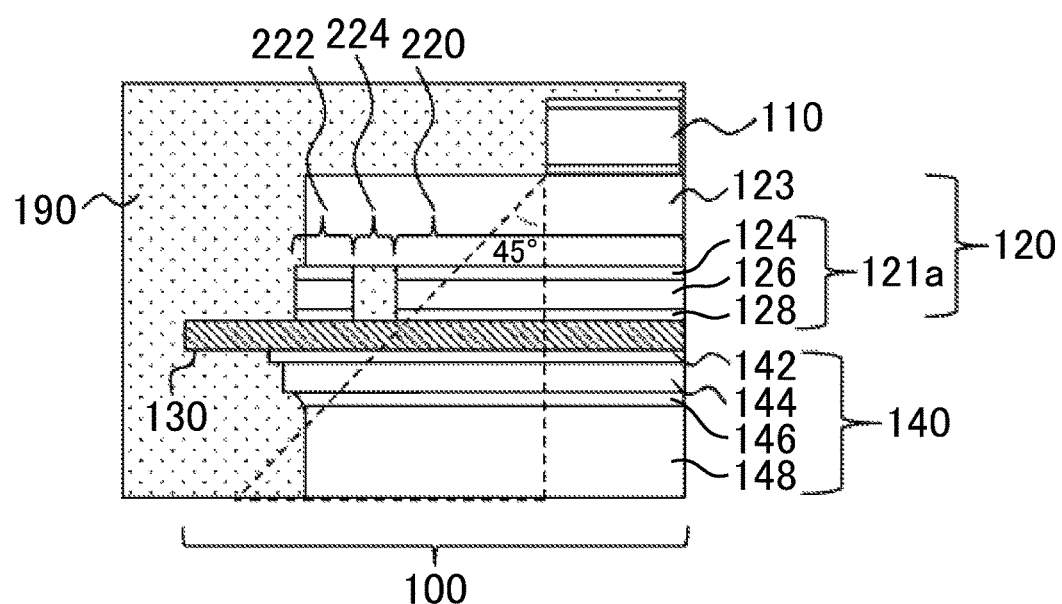
FIG. 7 is a cross-sectional view of a portion of the unit 100 of the semiconductor device 10 shown in FIG. 6.

FIG. 7 is a cross-sectional view of a portion of the unit 100 of the semiconductor device 10 shown in FIG. 6. As shown in FIG. 7, the body portion 220 and the convex portions 222 are provided on the first surface side of the insulating plate 130 and bonded to the insulating plate 130, and may be provided in the gap formation layer 121*a* including the bonding layer 124, the metal film 126, and the bonding layer 128. Some or all of the gaps 224 between the body portion 220 and the convex portions 222 are filled with the mold material between the metal plate 123 and the insulating plate 130. Furthermore, at least some of the gaps 226 (not shown in the drawings) between adjacent convex portions are filled with the mold material between the metal plate 123 and the insulating plate 130.

Here, some or all of the gaps 224 may be provided at positions outside a spatial region that expands at an angle of 45 degrees from the contact surface between the semiconductor element 110 and the first conducting portion 120 toward the insulating plate 130, as shown by the right-angle triangle formed by a dashed line in FIG. 7.

FIG. 7 is used to describe an embodiment in which the gaps 224 and the gaps 226 are not provided in the second conducting portion 140. Instead of or in addition to this, the second conducting portion 140 may include gaps that are filled with the mold material 190 between itself and the insulating plate 130 in at least a portion thereof. In this case, in the same manner as in the first conducting portion 120, the second conducting portion 140 may include the body portion and the convex portions, gaps may be provided between the body portion and the convex portion, and gaps may be provided between the convex portions.

Figure 8:
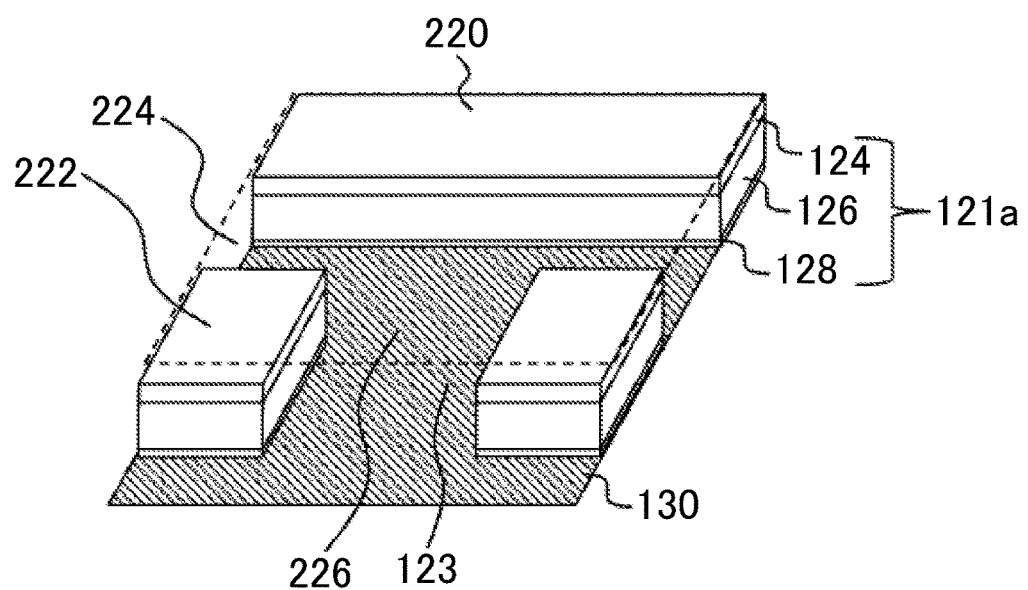
FIG. 8 is a perspective view relating to section A in FIG. 6.

FIG. 8 is a perspective view relating to section A in FIG. 6. In the drawing, the dotted lines represent the bottom surface of the metal plate 123. By having the gaps 226 and the gaps 224 in the gap formation layer 121*a* filled with the mold material 190, the semiconductor device 10 can more firmly fasten the mold material 190 and the unit 100 to each other.

In the embodiment shown in FIG. 8, since patterns of the body portion 220 and the convex portions 222 are not provided in the metal plate 123, as in the gap formation layer 121*a*, there is no need for additional processing to provide these patterns in the metal plate 123. Instead of this, pattern machining or the like may be performed in the metal plate 123 to provide a pattern corresponding to the body portion 220 and the convex portions 222.

(3: Semiconductor Device 10 Manufacturing Method)

Figure 9:
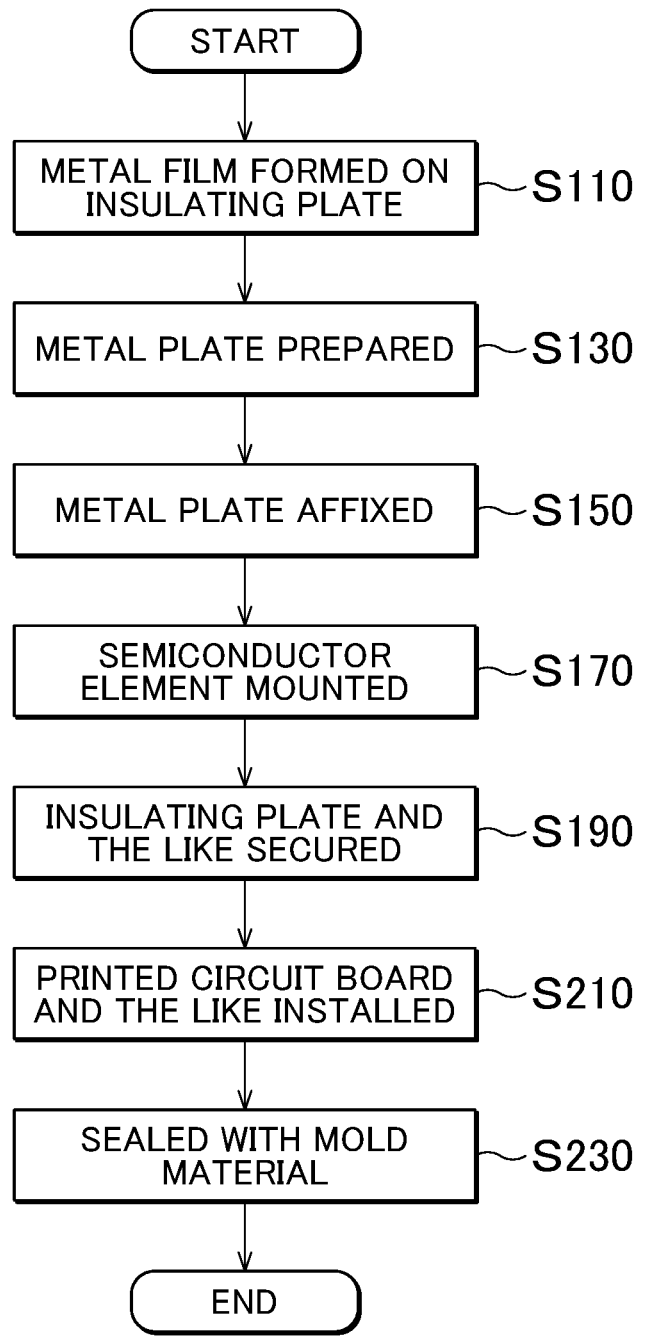
FIG. 9 shows an exemplary manufacturing method for the semiconductor device 10.

FIG. 9 shows an exemplary manufacturing method for the semiconductor device 10. The semiconductor device 10 is manufactured by performing the processes from S110 to S230.

First, at S110, the metal film 126 is formed on the first surface of the insulating plate 130, and the metal film 146 is formed on the second surface. As an example, a rectangular board made of $Si_3N_4$ is used as the insulating plate 130, and a copper foil patterned into the shape of the gap formation layer 121*a* and the gap formation layer 121*b* having the concave portions 125 as shown in (b) of FIG. 1 is bonded on one surface of the insulating plate 130 using AMB or DCB techniques to form the metal film 126. Instead of this, a copper foil patterned into the shape of the gap formation layer 121*a* and the gap formation layer 121*b* having the body portion 220, the convex portions 222, the gaps 224, and the gaps 226 as shown in (b) of FIG. 6 may be bonded on the insulating plate 130.

Furthermore, a copper foil patterned to have a substantially rectangular solid pattern is bonded to the other surface of the insulating plate 130 using AMB or DCB techniques to form the metal film 146. Here, copper foil having a substantially rectangular solid pattern that is smaller than the insulating plate 130 may be bonded to the insulating plate 130. With the AMB technique, when forming the metal film 126 (and/or the metal film 146), a brazing material is formed as the bonding layer 128 (and/or the bonding layer 148) between the insulating plate 130 and the metal film 126 (and/or the metal film 146).

Next, at step S130, the metal plate 123 and the metal plate 142 are prepared. For example, a copper plate patterned into a shape of the gap formation layer 121b and a shape of the gap formation layer 121a used for forming the metal film 126 in S110 in which the concave portions 125 (or the gaps 224 and gaps 226) are not provided is readied as the metal plate 123, and a copper plate having a substantially rectangular shape is prepared as the metal plate 142. Here, the shape of the metal plate 123 may be the shape of the gap formation layer 121b and the shape of the gap formation layer 121a including the concave portions 125 (or the gaps 224 and gaps 226).

Next, at S150, the metal plate 123 and the metal plate 142 prepared at S130 are affixed to the insulating plate 130 having the metal film 126 and the metal film 146 formed at S110 formed thereon. For example, a solder material is screen-printed as a paste that becomes the bonding layer 124 in accordance with the shape of the metal film 126 on the surface of the metal film 126 opposite the surface on which the insulating plate 130 is provided, and the metal plate 123 is mounted thereon. Furthermore, a solder material is screen-printed as a paste that becomes the bonding layer 144 in accordance with the shape of the metal film 146 on the surface of the metal film 146 opposite the surface on which the insulating plate 130 is provided, and the metal plate 142 is mounted thereon. Instead of a solder material that is a paste, a patterned solder material may be used.

By performing S110 to S150 in this manner, the insulating plate 130 is prepared that is provided with the first conducting portion 120 including the metal film 126 formed on the first surface and the metal plate 123 bonded to the metal film 126 and with the second conducting portion 140 including the metal film 146 formed on the second surface and the metal plate 142 bonded to the metal film 146.

Next, at S170, the semiconductor element 110 is mounted on the first conducting portion 120. For example, the semiconductor element 110 having a conductive bonding agent such as a solder material applied to both sides thereof is installed on the metal plate 123. As an example, semiconductor elements 110 are provided at a plurality of positions such as shown by the dotted lines in portion (b) of FIG. 1 for each unit 100.

Next, at S190, the insulating plate 130 having the semiconductor element 110 mounted thereon is stored and secured in a box-shaped securing jig.

Next, at S210, the printed circuit board 160 is installed on the insulating plate 130 having the semiconductor element 110 mounted thereon. For example, the printed circuit board 160 having the conducting post 170 affixed to the bottom side thereof in advance is affixed in a manner to face the insulating plate 130. As an example, the printed circuit board 160 is arranged such that the bottom end of the conducting post 170 contacts an electrode of the semiconductor element 110 via the conductive bonding agent on the top surface of the semiconductor element 110, and the printed circuit board 160 is secured by a securing jig in this state. After this, the external terminal 180 and the external terminal 182 are installed in the printed circuit board 160. For example, the external terminal 180 penetrates through the printed circuit board 160, the metal plate 123 and the external terminal 180 are connected via a conductive bonding agent such as a solder material, and the printed circuit board 160 and the external terminal 182 are connected via the conductive bonding agent. After this, the module being assembled is placed in a heating furnace and heated, thereby performing a reflow process that melts the solder material or the like.

Next, at S230, sealing is performed using the mold material 190. For example, as shown in (a) of FIG. 1, the first conducting portion 120 and the semiconductor element 110 on the first surface side of the insulating plate 130 are sealed with the mold material 190, such as epoxy resin. Here, the concave portions 125 between a portion of the first conducting portion 120 and the insulating plate 130 are also filled with the mold material 190. For example, in at least a portion of the region between the metal plate 123 and the insulating plate 130, gaps where the metal film 126 is not provided are filled with the mold material. As an example, the module being assembled is secured in a mold that has been heated in advance to a temperature (e.g. 100° C.) that is greater than or equal to the curing temperature of the mold material 190, and the sealing may be performed by pouring the uncured epoxy resin at a temperature (e.g. 50° C.) that is less than the curing temperature into the mold. In this way, it is possible to complete the sealing within a relatively short time form the pouring.

In the present embodiment, by performing the processes of S110 to S230, the semiconductor device 10 shown in FIG. 1 or FIG. 6 can be manufactured. In other words, with the manufacturing method according to the present embodiment, it is possible to manufacture a semiconductor device 10 that has improved adhesion between the unit 100 and the mold material 190 and improved reliability.

(4: Measurement of the Adhesive Strength)

Figure 10:
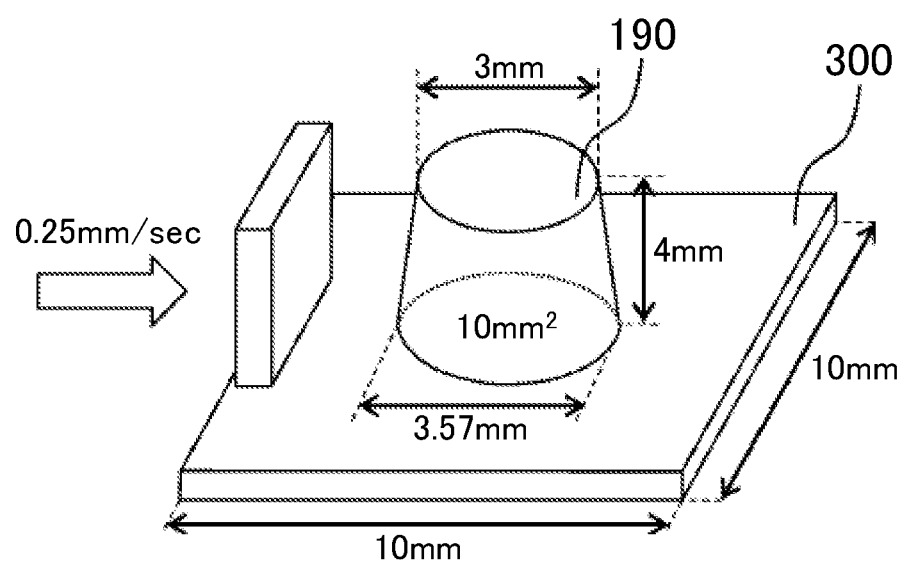
FIG. 10 shows an exemplary adhesive strength test.

FIG. 10 shows an exemplary adhesive strength test. The adhesive strength test is performed by securing the mold material 190 on each material and measuring the force occurring when the mold material 190 is peeled away when force is applied in the planar direction of each material. For example, each of the modules used in the adhesive strength test is formed by affixing solder to each material 300 that is a 10 mm×10 mm substrate formed of the respective material, performing the same thermal processing (e.g. 12 minutes at 245° C.) on each material, and cleaning and drying each material, after which the uncured mold material 190 is arranged in a manner to form a truncated cone shape in which the bottom surface is a circle with a diameter of 3.57 mm, the top surface is a circle with a diameter of 3 mm, and the height is 4 mm, and a thermal curing process (e.g. 60 minutes at 170° C.) is performed on the mold material 190. After this, a shear test was applied at a normal temperature and a rate of 0.25 mm/sec for each module used in the adhesive strength test to measure the breaking strength per unit area.

Figure 11:
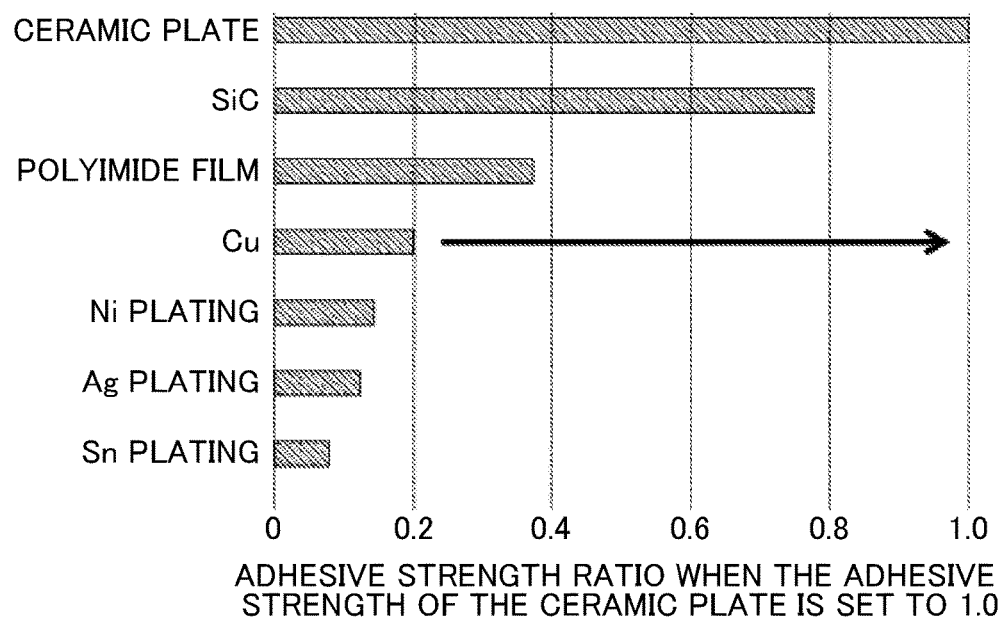
FIG. 11 shows the adhesive strength of the mold material 190 for each material.

FIG. 11 shows the adhesive strength for each material obtained from the adhesive strength test shown in FIG. 10. Here, (1) a ceramic plate (e.g. $Si_3N_4$), (2) SiC, (3) polyimide film, (4), Cu, (5) Ni plating, (6) Ag plating, and (7) Sn plating were used as the materials 300.

As shown in FIG. 11, compared to (4) the Cu used for the metal plate 123, (1) the ceramic plate used for the insulating plate 130 realized an adhesive strength that is approximately 4.5 times higher. In this way, it is understood that the insulating plate 130 has better adhesive strength than the metal plate 123 with respect to the mold material 190. Accordingly, with the semiconductor device 10 provided with the concave portions 125, the gaps 224, and the gaps 226 and having increased adhesive area between the insulating plate 130 and the mold material 190, it can be said that the adhesion between the mold material 190 and the unit 100 is stronger.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

10: semiconductor device, 100, 100a, 100b: unit, 110: semiconductor element, 120: first conducting portion, 121, 121a, 121b: gap formation layer, 122: gap, 123: metal plate, 124: bonding layer, 125: concave portion, 126: metal film, 128: bonding layer, 130: insulating plate, 140: second conducting portion, 142: metal plate, 144: bonding layer, 146: metal film, 148: bonding layer, 160: printed circuit board, 170: conducting post, 180: external terminal, 182: external terminal, 190: mold material, 220: body portion, 222: convex portion, 224: gap, 226: gap, 300: material

What is claimed is:

1. A semiconductor device comprising:
an insulating plate;
a first conducting portion formed on a first surface of the insulating plate;
a semiconductor element mounted on the first conducting portion; and
a mold material that seals the first conducting portion and the semiconductor element on the first surface side of the insulating plate, wherein
a material of the insulating plate has higher adhesion with respect to the mold material than a material of the first conducting portion,
the first conducting portion includes
a gap that is filled with the mold material between the first conducting portion and the insulating plate in a portion thereof,
a metal film formed on the first surface of the insulating plate, and
a metal plate bonded to the metal film, and
the metal plate extends further into the mold material than the metal film in a planar direction such that at least a portion of a region between the metal plate and the insulating plate is not provided with the metal film and includes the gap that is filled with the mold material.

2. The semiconductor device according to claim 1, wherein
the gap has, on the first surface of the insulating plate, at least one of a polygonal shape, a circular or elliptical shape, a shape having at least one bend or curve from an edge portion of the first conducting portion toward an inside of the gap, a shape in which an opening width increases from the edge portion of the first conducting portion toward the inside of the gap, a shape in which the opening width decreases from the edge portion of the first conducting portion toward the inside of the gap, a shape in which the opening width increases, then decreases, and then increases again from the edge portion of the first conducting portion toward the inside of the gap, and a shape in which the opening width decreases, then increases, and then decreases again from the edge portion of the first conducting portion toward the inside of the gap.

3. The semiconductor device according to claim 1, further comprising:
a second conducting portion provided on a second surface of the insulating plate, wherein
the second conducting portion includes a gap that is filled with the mold material between the second conducting portion and the insulating plate in a portion thereof.

4. The semiconductor device according to claim 1, wherein
at least a portion of the gap is provided outside of a spatial region expanding at an angle of 45 degrees from a contact surface between the semiconductor element and the conducting portion toward the insulating plate.

5. The semiconductor device according to claim 1, wherein
the first conducting portion includes a plurality of conducting members including a main conducting member having a largest area and at least one sub conducting member,
the plurality of conducting members being distanced from each other, and main conducting member among the plurality of conducting members.

6. The semiconductor device according to claim 1, wherein
the insulating plate is a ceramic plate.

7. The semiconductor device according to claim 1, wherein
the first conducting portion includes copper.

8. The semiconductor device according to claim 1, wherein
the mold material includes epoxy resin.

9. The semiconductor device according to claim 1, wherein
a force occurring when the mold material is hardened on the material of the insulating plate and the mold material is peeled away when a force is applied in a planar direction of the material of the insulating plate is greater than a force occurring when the mold material is hardened on the material of the first conducting portion and the mold material is peeled away when a force is applied in a planar direction of the material of the first conducting portion.

10. A manufacturing method of the semiconductor device according to claim 1, comprising:
preparing the insulating plate having the first conducting portion provided on the first surface thereof;
mounting the semiconductor element on the first conducting portion; and
sealing the first conducting portion and the semiconductor element on the first surface side of the insulating plate with the mold material, wherein
the material of the insulating plate has higher adhesion with respect to the mold material than the material of the first conducting portion, and
the sealing includes filling, with the mold material, the gap between a portion of the first conducting portion and the insulating plate.

11. A semiconductor device comprising:
an insulating plate;
a first conducting portion provided on a first surface of the insulating plate;

a semiconductor element mounted on the first conducting portion; and a mold material that seals the first conducting portion and the semiconductor element on the first surface side of the insulating plate, wherein the first conducting portion includes:

a plurality of convex portions provided on the insulating plate side and bonded to the first surface of the insulating plate at different positions distanced from each other;

a gap that is filled with the mold material between the first conducting portion and the insulating plate, in at least a portion of a region between adjacent convex portions among the plurality of adjacent convex portions;

a metal film formed on the first surface of the insulating plate; and a metal plate bonded to the metal film, and the metal plate extends further into the mold material than the metal film in a planar direction such that at least a portion of a region between the metal plate and the insulating plate is not provided with the metal film and includes the gap that is filled with the mold material.

12. The semiconductor device according to claim 2, wherein the gap has, on the first surface of the insulating plate, at least one of a polygonal shape, a circular or elliptical shape, a shape having at least one bend or curve from an edge portion of the first conducting portion toward an inside of the gap, a shape in which an opening width increases from the edge portion of the first conducting portion toward the inside of the gap, a shape in which the opening width decreases from the edge portion of the first conducting portion toward the inside of the gap, a shape in which the opening width increases, then decreases, and then increases again from the edge portion of the first conducting portion toward the inside of the gap, and a shape in which the opening width decreases, then increases, and then decreases again from the edge portion of the first conducting portion toward the inside of the gap.

13. The semiconductor device according to claim 11, further comprising:

a second conducting portion provided on a second surface of the insulating plate, wherein the second conducting portion includes a gap that is filled with the mold material between the second conducting portion and the insulating plate in a portion thereof.

14. A manufacturing method of the semiconductor device according to claim 11, comprising:

preparing the insulating plate having the first conducting portion provided on the first surface thereof;

mounting the semiconductor element on the first conducting portion; and sealing the first conducting portion and the semiconductor element on the first surface side of the insulating plate with the mold material, wherein the first conducting portion includes the plurality of convex portions provided on the insulating plate side and bonded to the first surface of the insulating plate at the different positions distanced from each other, and the sealing includes filling, with the mold material, the gap between the first conducting portion and the insulating plate, in at least the portion of the region between the adjacent convex portions.

15. A semiconductor device comprising:

an insulating plate;

a first conducting portion that includes a metal film formed on a first surface of the insulating plate and a metal plate bonded to the metal film;

a semiconductor element mounted on the metal plate; and a mold material that seals the first conducting portion and the semiconductor element on the first surface side of the insulating plate, wherein the metal plate extends further into the mold material than the metal film in a planar direction such that at least a portion of a region between the metal plate and the insulating plate is not provided with the metal film and includes a gap that is filled with mold material.

16. The semiconductor device according to claim 15, wherein the gap has, on the first surface of the insulating plate, at least one of a polygonal shape, a circular or elliptical shape, a shape having at least one bend or curve from an edge portion of the first conducting portion toward an inside of the gap, a shape in which an opening width increases from the edge portion of the first conducting portion toward the inside of the gap, a shape in which the opening width decreases from the edge portion of the first conducting portion toward the inside of the gap, a shape in which the opening width increases, then decreases, and then increases again from the edge portion of the first conducting portion toward the inside of the gap, and a shape in which the opening width decreases, then increases, and then decreases again from the edge portion of the first conducting portion toward the inside of the gap.

17. The semiconductor device according to claim 15, further comprising:

a second conducting portion provided on a second surface of the insulating plate, wherein the second conducting portion includes a gap that is filled with the mold material between the second conducting portion and the insulating plate in a portion thereof.

18. A manufacturing method of the semiconductor device according to claim 15, comprising:

preparing the insulating plate on which is provided the first conducting portion that includes the metal film formed on the first surface of the insulating plate and the metal plate bonded to the metal film;

mounting the semiconductor element on the metal plate; and sealing the first conducting portion and the semiconductor element on the first surface side of the insulating plate with the mold material, wherein the sealing includes filling the gap in which the metal film is not provided with the mold material, in at least the portion of the region between the metal plate and the insulating plate.

* * * * *